(12) United States Patent
Kapusta

(10) Patent No.: US 8,537,045 B2
(45) Date of Patent: Sep. 17, 2013

(54) PRE-CHARGED CAPACITIVE DIGITAL-TO-ANALOG CONVERTER

(75) Inventor: Ronald Kapusta, Bedford, MA (US)

(73) Assignee: Analog Devices, Inc., Norwood, MA (US)

(*) Notice: Subject to any disclaimer, the term of this patent is extended or adjusted under 35 U.S.C. 154(b) by 148 days.

(21) Appl. No.: 13/096,686

(22) Filed: Apr. 28, 2011

(65) Prior Publication Data

US 2012/0274488 A1 Nov. 1, 2012

(51) Int. Cl.
*H03M 1/12* (2006.01)

(52) U.S. Cl.
USPC ............................ 341/172; 341/144; 341/150

(58) Field of Classification Search
USPC .......................................... 341/150, 144, 172
See application file for complete search history.

(56) References Cited

U.S. PATENT DOCUMENTS

| | | | |
|---|---|---|---|
| 6,094,155 A | 7/2000 | Fees | |
| 6,496,131 B2 | 12/2002 | Yoshinaga | |
| 7,129,877 B2* | 10/2006 | Wang et al. | 341/150 |
| 7,456,769 B2* | 11/2008 | Wang et al. | 341/143 |
| 7,791,520 B2 | 9/2010 | Mathe et al. | |
| 2002/0054005 A1* | 5/2002 | Edwards et al. | 345/87 |
| 2002/0190971 A1* | 12/2002 | Nakamura et al. | 345/204 |
| 2004/0257256 A1 | 12/2004 | Leung et al. | |
| 2007/0030037 A1* | 2/2007 | Wang et al. | 327/93 |
| 2010/0265113 A1* | 10/2010 | Yoshioka | 341/150 |

OTHER PUBLICATIONS

McCreary et al., "All-MOS Charge Redistribution Analog-to-Digital Conversion Techniques—Part I," IEEE Journal of Solid-State Circuits, vol. 10, No. 6, pp. 371-379, Dec. 1975.
Craninckx et al., "A 65fJ/Conversion-Step 0-to-50MS/s 0-to-0.7mW 9b Charge-Sharing SAR ADC in 90nm Digital CMOS," 2007 IEEE International Solid-State Circuits Conference, Digest of Technical Papers, pp. 246-247,600, Feb. 2007.
Giannini et al., "An 820μW 9b 40MS/s Noise-Tolerant Dynamic-SAR ADC in 90nm Digital CMOS," 2008 IEEE International Solid-State Circuits Conference, Digest of Technical Papers, pp. 238-239,610, Feb. 2008.
International Search Report and Written Opinion of the International Searching Authority in counterpart International application No. PCT/US2012/035236, communication dated Sep. 21, 2012.

\* cited by examiner

*Primary Examiner* — Jean B Jeanglaude
(74) *Attorney, Agent, or Firm* — Kenyon & Kenyon LLP

(57) ABSTRACT

Embodiments of the present disclosure may provide a charge redistribution DAC with two sets of capacitors that provides a DAC output by sharing charges between a plurality of pairs of capacitors in lieu of charging the capacitors using traditional external reference voltages. The charge redistribution DAC may comprise a plurality of pairs of first and second capacitors that each has a first side and a second side, and a group of first switches and a group of second switches. Each first or second switch selectively controls connection of the first side of a respective first or second capacitor to one of a pair of output signal lines according to a DAC input word. The charge redistribution DAC further may comprise a group of bridging switches each connected between second sides of paired first and second capacitors.

32 Claims, 10 Drawing Sheets

PRE-CHARGED CAPACITIVE DIGITAL-TO-ANALOG CONVERTER

FIELD OF INVENTION

The present invention relates to signal processors, and more particularly to a charge redistribution digital-to-analog converter (DAC) that may carry on a charge redistribution entirely on an IC chip.

BACKGROUND

Charge redistribution DACs are common in modern integrated circuits, particularly in switched capacitor CMOS designs. They have uses in many applications, including analog-to-digital (ADC) architectures such as pipeline and successive approximation (SAR) ADCs. Depending on the application, key performance metrics can be the linearity of the DAC and its settling speed.

An exemplary 3-bit charge redistribution DAC 100 is shown in FIGS. 1A and 1B. The DAC 100 is composed of a terminating capacitor 102 and an array of binary-weighted capacitors 104.1, 104.2 and 104.3 with respective capacitances of 1C, 1C, 2C and 4C. The DAC 100 may operate in two phases. During a first phase, as shown in FIG. 1A, a switch 108 is closed to connect the DAC output to a common mode voltage VCM and the capacitors 104.1-104.3 are all connected to a ground GND by the switches 106.1-106.3 respectively. The DAC output is thus kept at VCM during the first phase.

During the second phase, the switch 108 is open and the DAC output is generated by the DAC capacitors 104.1-104.3 and the terminating capacitor 102. In the second phase, each bit of the DAC input word (a 3 bit binary digital word) controls a respective switch of the switches 106.1, 106.2 and 106.3 to connect a respective capacitor of the capacitors 104.1-104.3 to either a reference voltage $V_{REF}$ or the ground GND. Typically, a digital "1" controls a corresponding switch to connect to the reference voltage $V_{REF}$ and a digital "0" controls a corresponding switch to connect to the GND. The DAC output is determined by an equation of $V_{out}=VCM+V_{REF}*C_{selected}/C_{total}$, in which $C_{selected}$ is the amount of capacitance selected by the DAC word to connect to the reference voltage $V_{REF}$, and $C_{total}$ is the sum of all capacitance in the DAC 100. For example, as shown in FIG. 1B, if the DAC input word is 110, the capacitors 104.2 and 104.3 are selected by connecting the switches 106.2 and 106.3 to the reference voltage $V_{REF}$, and the switch 106.1 connects the capacitor 104.1 to the ground GND. The output would be $V_{out}=VCM+V_{REF}*(4C+2C)/(4C+2C+1C+1C)=VCM+6/8*V_{REF}$.

The reference voltage $V_{REF}$ and ground GND have parasitic inductances ("parasitics") associated with them (e.g., $L_{PAR1}$ and $L_{PAR2}$). When any one of the DAC capacitors switches from $V_{REF}$ to GND (or vice versa), the voltage at the DAC output will ring for some period of time, depending on characteristics of the parasitics and capacitance of the DAC 100. In a typical integrated circuit, the ringing phenomenon limits the frequency at which the DAC can be driven.

Thus, at high-speeds, the performance of the DAC is often limited by the parasitics inductance. Accordingly, there is a need to improve the speed at which the charge redistribution DAC settles, in particular for a SAR ADC application.

DETAILED DESCRIPTION

Embodiments of the present disclosure may provide a charge redistribution DAC with two sets of capacitors that provides a DAC output by sharing charges between a plurality of pairs of capacitors in lieu of charging the capacitors using traditional external reference voltages. The charge redistribution DAC may comprise a plurality of pairs of first and second capacitors that each has a first side and a second side, and a group of first switches and a group of second switches. Each first or second switch selectively controls connection of the first side of a respective first or second capacitor to one of a pair of output signal lines according to a DAC input word. The charge redistribution DAC further may comprise a group of bridging switches each connected between second sides of paired first and second capacitors.

Another embodiment of the present invention may provide a method for generating a digital-to-analog output for a digital-to-analog converter (DAC). The method may comprise connecting first sides a plurality of pairs of first and second capacitors to a common mode voltage and sampling a first or second external reference voltages to second sides of each of first capacitors or second capacitors. The method further may comprise disconnecting the first sides of the plurality of pairs of first and second capacitors from the common mode voltage, and connecting the first sides of the first and second capacitors to a first or second signal lines according to a DAC input word. Also, the method may comprise disconnecting the second sides of the first and second of capacitors from the first and second external reference voltages, and shorting the second sides of the first and second set of capacitors in pairs respectively.

Figure 1A:
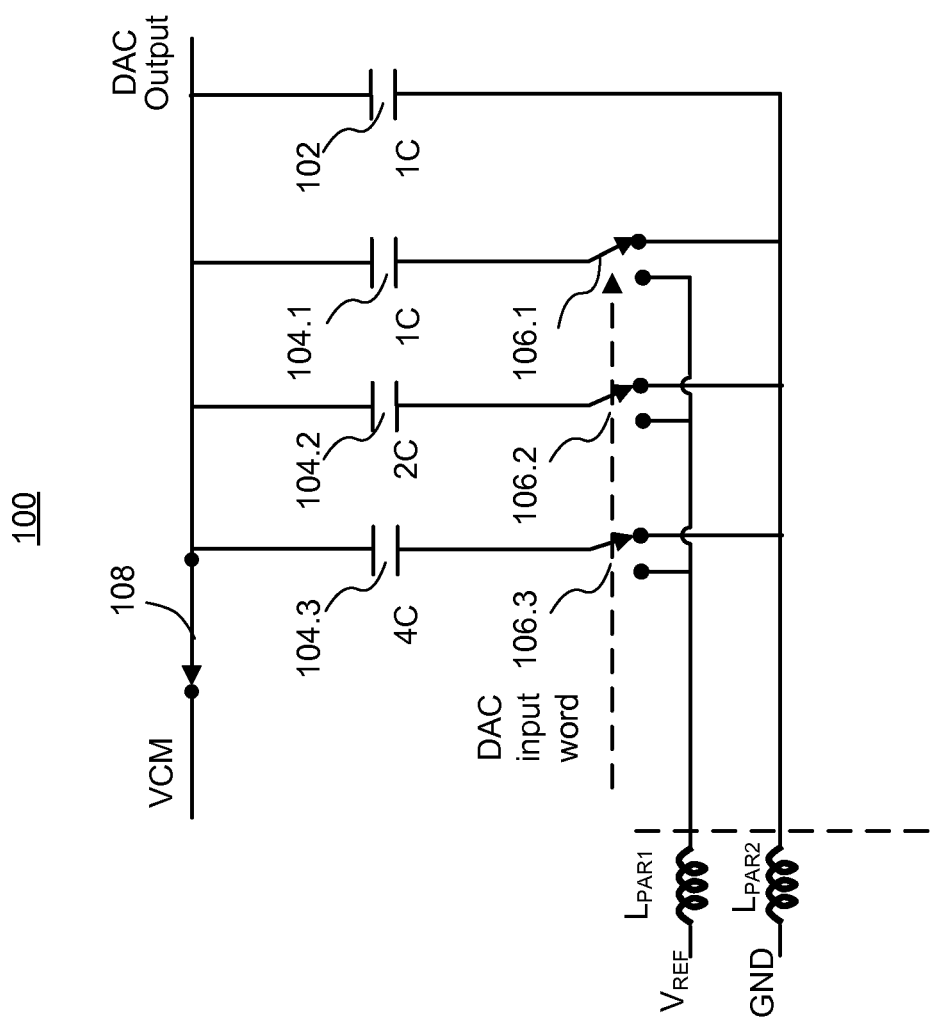
FIGS. 1A and 1B show a traditional charge redistribution DAC.
Figure 1B:
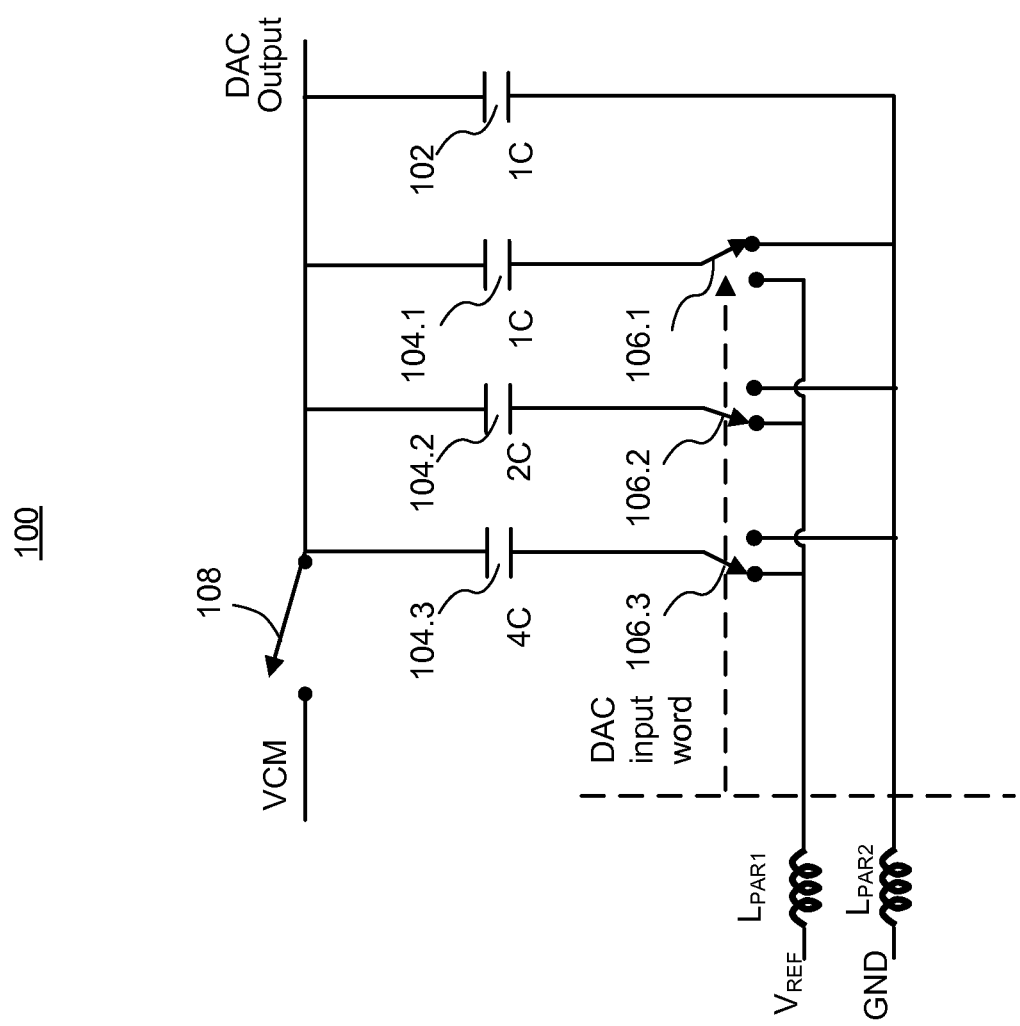
Figure 2A:
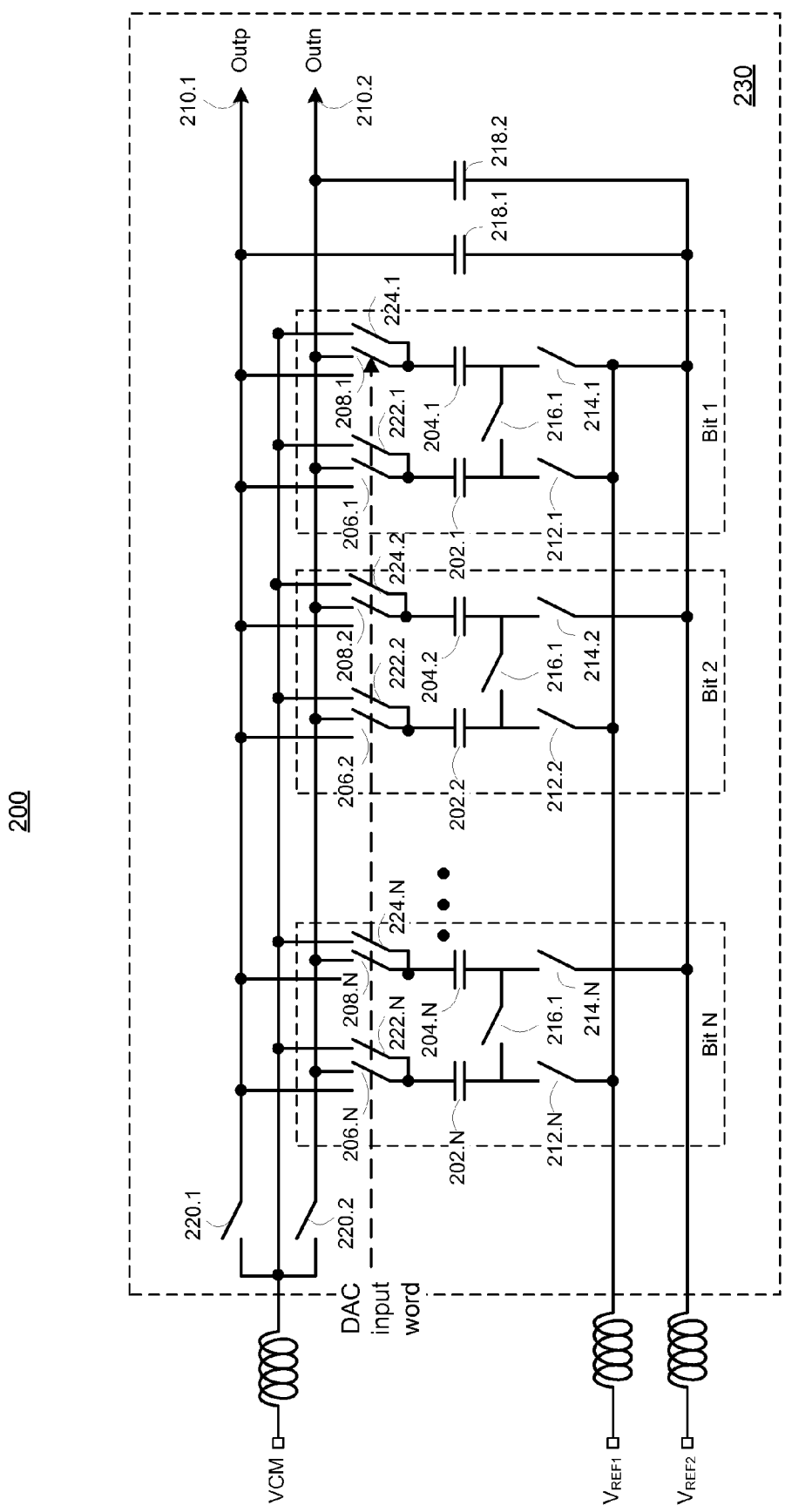
FIG. 2A shows a charge redistribution DAC according to one embodiment of the present invention.

FIG. 2A illustrates a charge redistribution DAC 200 according to an embodiment of the present invention. The charge redistribution DAC 200 may be an N-bit DAC (e.g., N being an integer number larger than one). The DAC 200 may include two sets of binary-weighted capacitors 202.1-202.N (e.g., first capacitors) and 204.1-204.N (e.g., second capacitors). Thus, the DAC 200 includes a pair of capacitors (e.g., 202.1 and 204.1) for each bit position supported by the DAC 200. The DAC 200 further may include a plurality of switches 222.1-222.N and 224.1-224.N selectively coupling first plates of the capacitors 202.1-202.N and 204.1-204.N to a common-mode voltage VCM. The DAC 200 further may include output switches 206.1-206.N and 208.1-208.N selectively coupling a first plate of the capacitors 202.1-202.N and 204.1-204.N to either a positive output terminal 210.1 or a negative output terminals 210.2 of the DAC 200. The DAC 200 also may include sets of input switches 212.1-212.N and 214.1-214.N selectively coupling second plates of the capacitors to one of a pair of reference voltage sources $V_{REF1}$, $V_{REF2}$. Further, the DAC 200 may include a bridging switch 216.1-216.N at each bit position to selectively short the second plates of the pair of the capacitors (e.g., 202.1 and 204.1) together. In one embodiment, all of these components of the charge redistribution DAC 200 may be integrated on a common IC chip 230 (e.g., on the same die).

The DAC further may include an additional pair of capacitors 218.1, 218.2, called terminating capacitors, which have a capacitance C that matches the capacitors used in the least significant bit position. The DAC also may include a pair of switches 220.1 and 220.2 that selectively engage or disengage the common mode voltage source VCM from the output terminals 210.1, 210.2.

The output switches 206.1-206.N and 208.1-208.N may be controlled by a DAC input word. The DAC input word may be an N-bit binary digital word with each bit controlling a pair of switches (e.g., 206.1 and 208.1, 206.N and 208.N) respectively. In one embodiment, each pair of DAC capacitors may be controlled by a respective bit of a DAC input word. For example, each set of the binary weighted capacitors 202.1-202.N and 204.1-204.N may have capacitances of $2^0C$, $2^1C$, ... and $2^{N-1}C$ respectively. The pair of capacitors 202.1 and 204.1 may each have a unit capacitance (e.g., 1C) and may correspond to the LSB, and thus the switches 206.1 and 208.1 may be controlled by the least significant bit (LSB) of the DAC input word. The pair of capacitors 202.N and 204.N may each have $2^{N-1}$ unit capacitance and may correspond to the most significant bit (MSB), and thus the switches 206.N and 208.N8 may be controlled by the most significant bit (MSB) of the DAC input word. In one embodiment, the unit capacitance may be any suitable capacitance value.

Figure 2B:
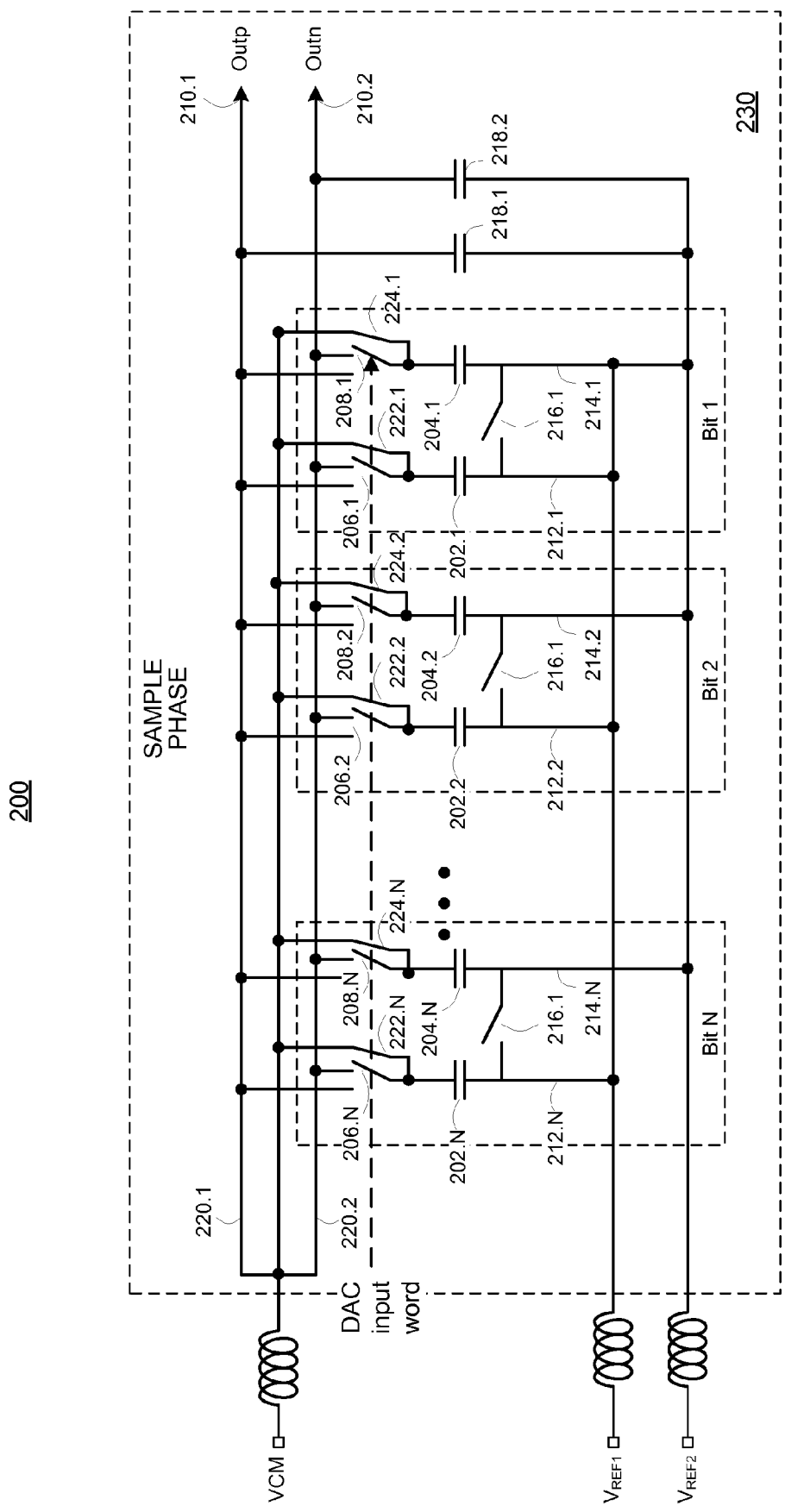
FIGS. 2B and 2C show the charge redistribution DAC of FIG. 2A in operation according to one embodiment of the present invention.
Figure 2C:
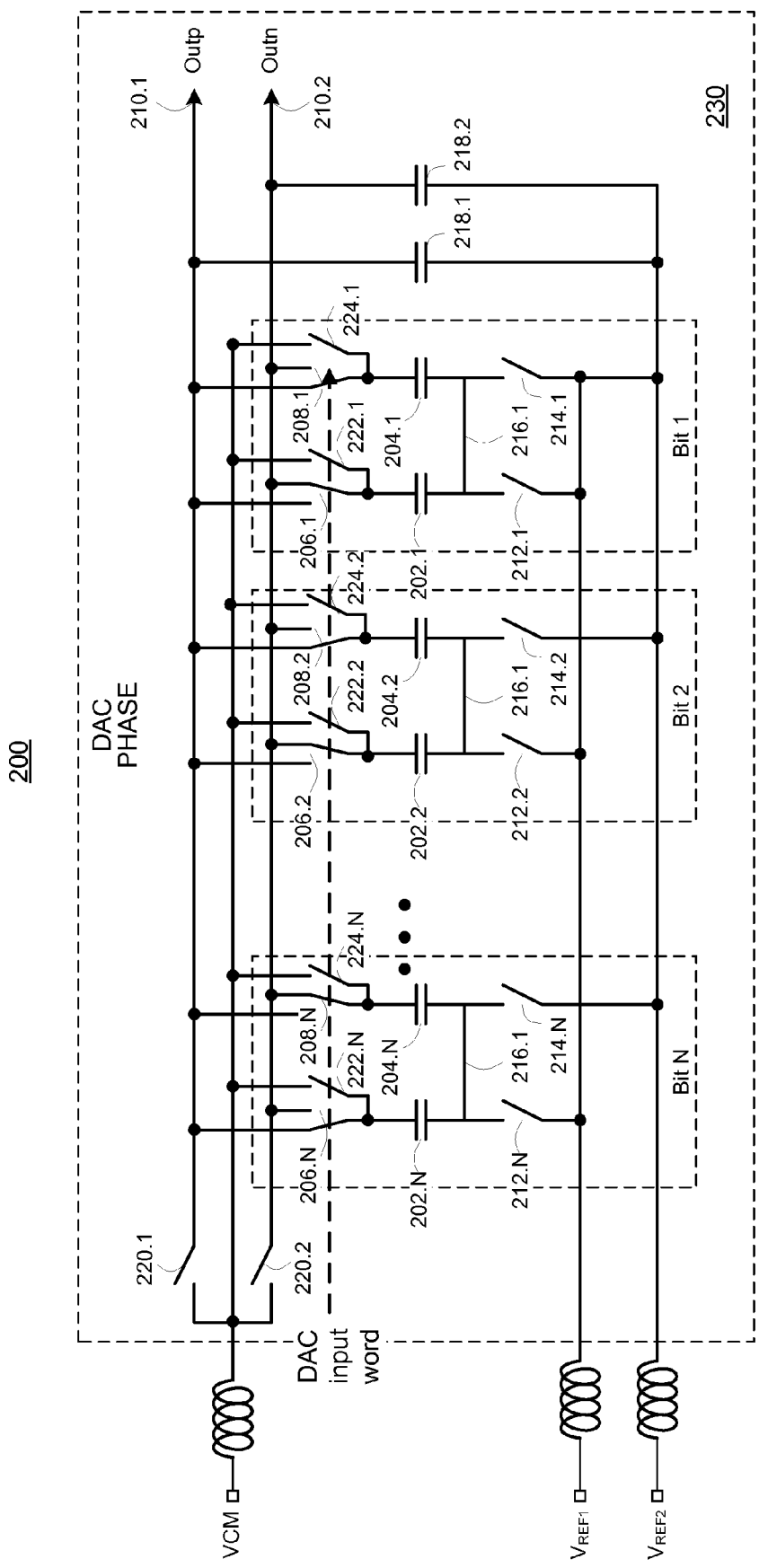

FIGS. 2B and 2C show the charge redistribution DAC 200 working in two different phases according to one exemplary embodiment of the present invention. FIG. 2B shows the charge redistribution DAC 200 working in a first phase (e.g., a Sample Phase). During the first phase of operation, for example, the Sample Phase, the pair of switches 208.1 and 208.2 may be closed and the two output terminals 210.1, 210.2 may be coupled to the common mode voltage VCM. The first plates of all DAC capacitors 202.1-202.N and 204.1-204.N may be electrically connected to the common mode voltage VCM by the switches 222.1-222.N and 224.1-224.N. Meanwhile, the second sides of the first set of the binary weighted capacitors 202.1-202.N may be electrically connected to the first reference voltage $V_{REF1}$ by the switches 212.1-212.N and the second sides of the second set of the binary weighted capacitors 204.1-204.N may be electrically connected to the second reference voltage $V_{REF2}$ by the switches 214.1-214.N. During this phase, the second sides (e.g., back plates) of the first set of the binary weighted capacitors 202.1-202.N may be charged to $V_{REF1}$ and the second sides (e.g., back plates) of the second set of the binary weighted capacitors 204.1-204.N may be charged to $V_{REF2}$.

FIG. 2C shows the charge redistribution DAC 200 working in a second phase (e.g., a DAC phase). During the second phase of operation, the switches 220.1 and 220.2 may let open to disconnect the DAC output terminals 210.1, 210.2 from the common-mode voltage VCM. The second sides of each pair of the DAC capacitors (e.g., 202.1 and 204.1, ..., 202.N and 204.N) may be electrically shorted together by closing the bridging switches 216.1-216.N. The voltage level at the second sides of the DAC capacitors may be $(V_{REF1}+V_{REF2})/2$. The switches 222.1-222.N and 224.1-224.N may be open to disconnect the first sides of the DAC capacitors from the VCM. Instead, the first sides of each pair of the DAC capacitors (e.g., 202.1 and 204.1, ..., 202.N and 204.N) may be electrically connected to the DAC output terminals 210.1, 210.2 in a way determined by the DAC input word via the corresponding switches 206.1-206.1 and 208.1-208.N. The DAC output may be determined by an equation of $V_{out}=V_{out+}-V_{out-}=2*(V_{REF1}+V_{REF2})*(C_{selected}/C_{total}-0.5)$, where $C_{selected}$ is the total capacitance that have been pre-charged to the first voltage reference $V_{REF1}$ and then connected to the first DAC positive output terminal 210.1. $C_{total}$ may be the total capacitance of one set of binary weighted capacitors 202.1-202.N (or 204.1-204.N).

During the second phase of operation, if a bit of the DAC input word is "1," the first sides of the corresponding first capacitor may be coupled to the positive output terminal 210.1 and the first side of the corresponding second capacitor may be coupled to the negative output terminal 210.2. In contrast, if a bit of the DAC input word is "0," the first sides of the corresponding first capacitor may be coupled to the negative output terminal 210.2 and the first side of the corresponding second capacitor may be coupled to the positive output terminal 210.1. In the example shown in FIG. 2C, the input word may be a "1 ... 00" with the MSB being 1 and the last two LSBs being 0.

Figure 2D:
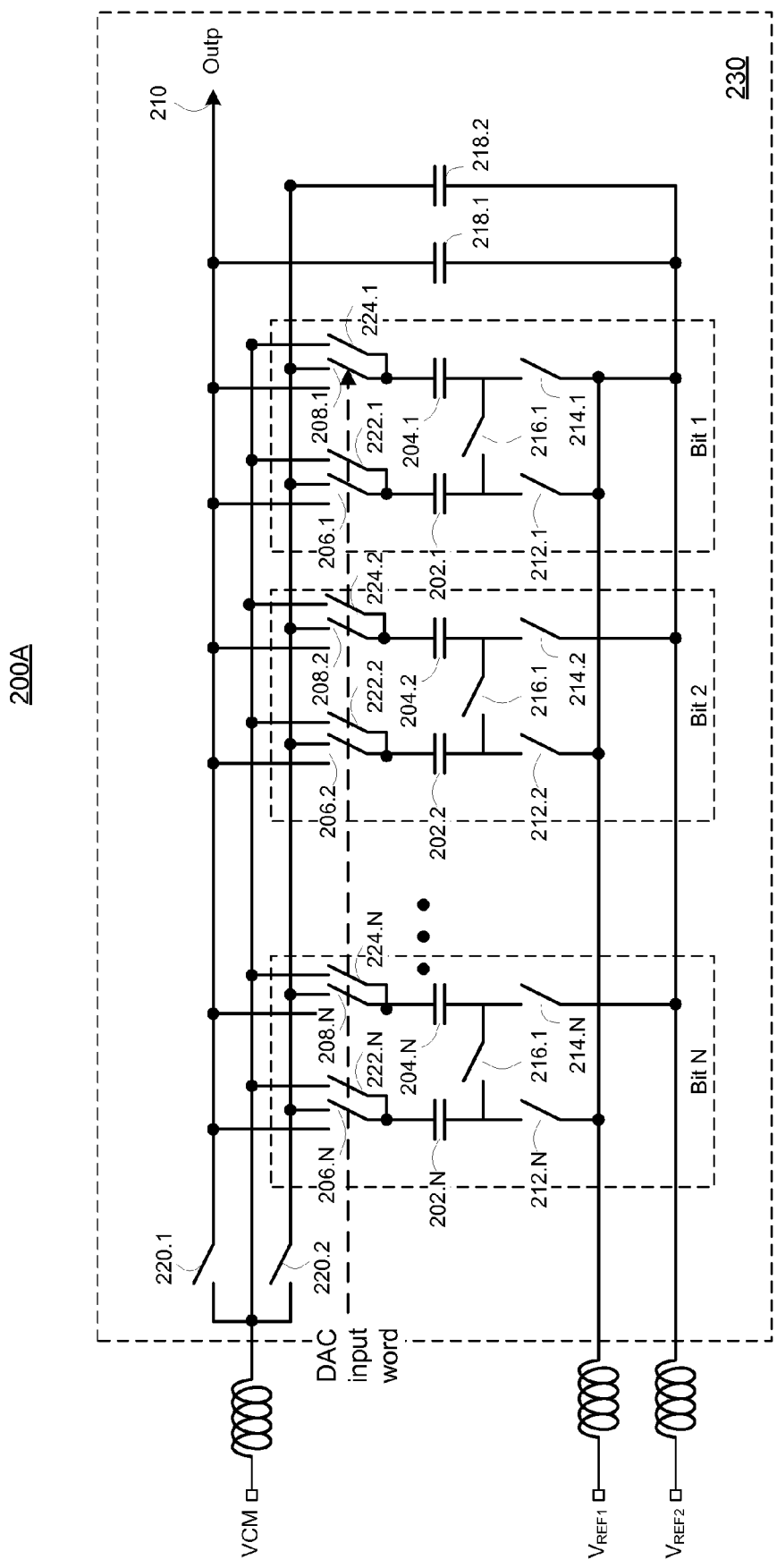
FIG. 2D shows a charge redistribution DAC according to another embodiment of the present invention.

FIG. 2D shows a charge redistribution DAC 200A according to another embodiment of the present invention. The charge redistribution DAC 200A may be a single ended implementation in contrast to the differential implementation of the charge redistribution DAC 200. That is, the charge redistribution DAC 200A may have a single output terminal 210, which may be similar to the positive output terminal 210.1 of the charge redistribution DAC 200 (the negative output terminal 210.2 of the charge redistribution DAC 200 may be discarded). The charge redistribution DAC 200A may be identical to the charge redistribution DAC 200 in all other aspects.

Figure 3:
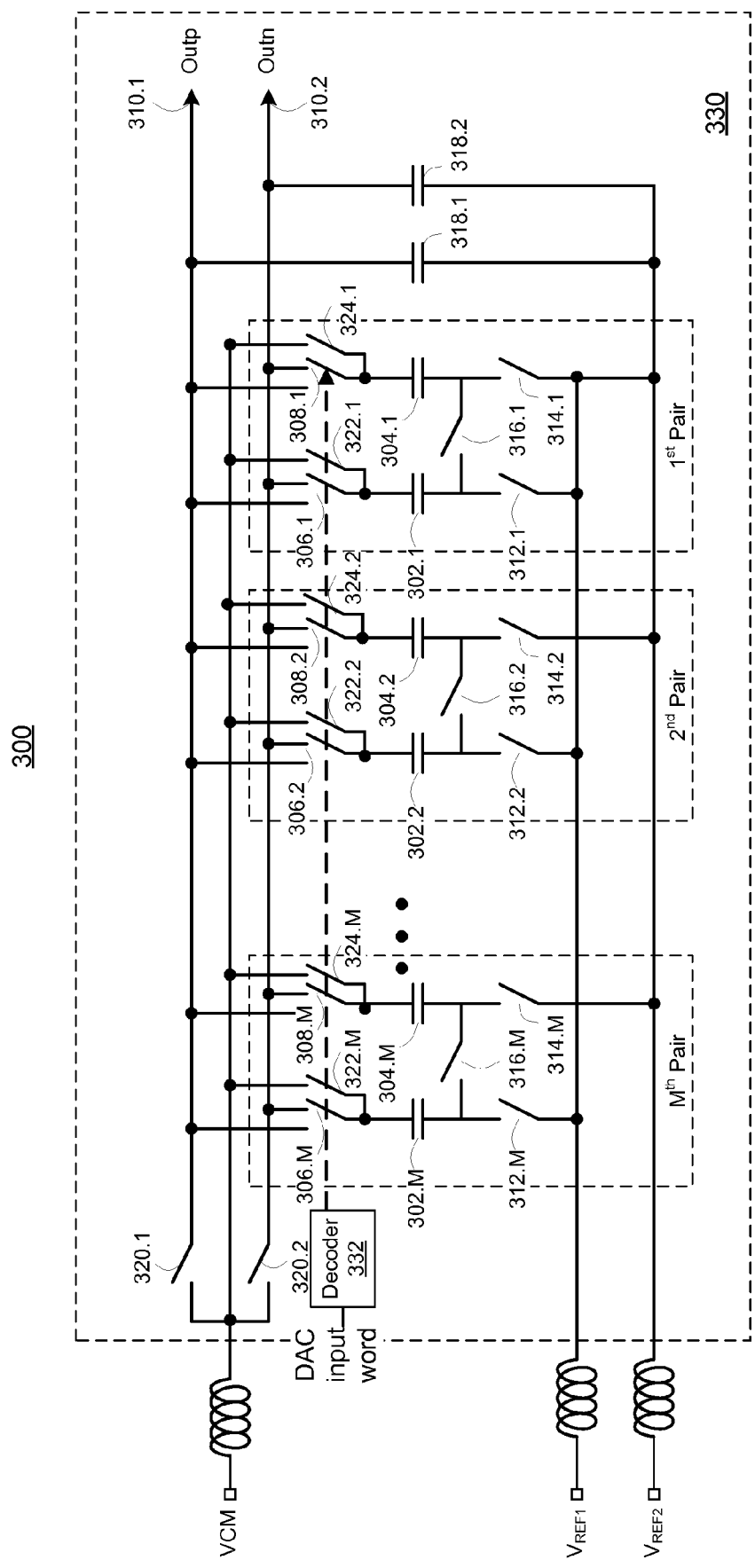
FIG. 3 shows a charge redistribution DAC according to another embodiment of the present invention.

FIG. 3 shows a charge redistribution DAC 300 according to another embodiment of the present invention. The charge redistribution DAC 300 may be an N-bit DAC that includes a set of first capacitors 302.1-302.M and a set of second capacitors 304.1-304.M (the number M may be equal to $2^N-1$). Thus, the DAC 300 includes M pairs of first and second capacitors (e.g., 302.1 and 304.1, ..., 302.M and 304.M). The DAC further may include an additional pair of terminating capacitors 318.1, 318.2, which have a capacitance C that matches the capacitance of each of the capacitors 302.1-302.M and 304.1-304.M. In one embodiment, each of the capacitors 318.1, 318.2, 302.1-302.M and 304.1-304.M may have a unit capacitance.

The DAC 300 further may include a plurality of switches 322.1-322.M and 324.1-324.M selectively coupling first plates of the capacitors 302.1-302.M and 304.1-304.M to a common-mode voltage VCM. The DAC 300 further may include output switches 306.1-306.M and 308.1-308.M selectively coupling the first plates of the capacitors 302.1-302.M and 304.1-304.M to either a positive output terminal 310.1 or a negative output terminals 310.2. The output switches 306.1-306.M and 308.1-208.M may be controlled by a decoder 332 that decodes an N-bit DAC input word. The DAC 300 also may include two sets of input switches 312.1-312.M and 314.1-314.M selectively coupling second plates of the capacitors to one of a pair of reference voltage sources $V_{REF1}$, $V_{REF2}$. Further, the DAC 300 may include a bridging switch 316.1-316.M to selectively short the second plates of each pair of the first and second capacitors together. The DAC also may include a pair of switches 320.1 and 320.2 that selectively engage or disengage the common mode voltage source VCM from the output terminals 310.1, 310.2. In one embodiment, all of these components of the charge redistribution DAC 300 may be integrated on a common IC chip 330 (e.g., on the same die). In one embodiment, the charge redistribution DAC 300 may use unit capacitors controlled in a "thermometer-coded" manner by the decoder 332 that decodes the N-bit DAC input word.

The DAC 300 may also work in two phases during operation, similar to the DAC 200. During the first phase of operation, the pair switches 320.1 and 320.2 may be closed and the two DAC output terminals 310.1 and 310.2 may be coupled to the common mode voltage VCM. The first sides of capacitors 302.1-302.M and 304.1-304.M may be electrically connected to the common mode voltage VCM by the switches 322.1-322.M and 324.1-324.M. The second sides of the first capacitors 302.1-302.M may be electrically connected to the first reference voltage $V_{REF1}$ and the second sides of the second capacitors 304.1-304.M may be electrically connected to the second reference voltage $V_{REF2}$.

During the second phase of operation, the switches 320.1 and 320.2 may be left open to disconnect the DAC output terminals 310.1 and 310.2 from the common-mode voltage VCM. The second sides of each pair of the DAC capacitors (e.g., 302.1 and 304.1, . . . , 302.M and 304.M) may be respectively electrically shorted together. The first sides of the first and second capacitors 302.1-302.M and 304.1-304.M may be electrically connected to the DAC output terminals 310.1 or 310.2 controlled by the output switches 306.1-306.M and 308.1-208.M, which in turn are controlled by the decoder 332 according to the DAC input word.

The DAC output may be determined by an equation of $V_{out} = V_{out+} - V_{out-} = 2*(V_{REF1} + V_{REF2})(C_{selected}/C_{total} - 0.5)$, where $C_{selected}$ is the total capacitance that have been precharged to the first voltage reference $V_{REF1}$ and then connected to the positive output terminal 310.1. $C_{total}$ is the total capacitance of one set of capacitors 302.1-302.M2 (or 304.12-304.M2). The decoder 332 may generate control signals for the output switches 306.1-306.M and 308.1-308.M based on the DAC input word to select first sides of some of the first capacitors to be connected to the positive output terminal 310.1 and first sides of others of the first capacitors to be connected to the negative output terminal 310.2. For each first capacitor selected to be connected to the positive output terminal 310.1, the second capacitor in the pair may be connected to the negative output terminal 310.2. Meanwhile, for each first capacitor not selected to be connected to the positive output terminal 310.1, the second capacitor in the pair may be connected to the positive output terminal 310.1.

The DAC input word may be an N-bit binary word having a value range of $0 \sim 2^N - 1$ (e.g., for N=3, the value range may be 0~7). When the DAC input word has a specific value F, the decoder 332 may select F first capacitors from the M first capacitors 302.1-302.M to be connected to the positive output terminal 310.1 and let the remaining (M minus F) first capacitors to be connected to the negative output terminal 310.2.

For example, assuming N=3 and F=5 (e.g., corresponds to binary DAC input word "101"). During the first phase of operation, all 7 first capacitors (M=$2^N - 1$=7) may be charged to the first voltage reference $V_{REF1}$. During the second phase of operation, five (5) first capacitors may be selected to connect their respective top sides to the positive output terminal 310.1 and their corresponding second capacitors in the pairs may have their respective top sides connected to the negative output terminal 310.2. At the same time, the remaining two (2) first capacitors may have their respective top sides connected to the negative output terminal 310.2 and their corresponding second capacitors may have their respective top sides connected to the positive output terminal 310.1. In another example, if F is zero, during the second phase of operation, all first capacitors may be selected to connect their respective top sides to the negative output terminal 310.2 and all second capacitors may have their respective top sides connected to the positive output terminal 310.1.

In one embodiment, because all first capacitors 302.1-302.M may have a unit capacitance, they may be selected indiscriminately during operation to connect to the positive output terminal 310.1. Moreover, in one embodiment, the charge redistribution DAC 300 may be applied in a single ended implementation, in which the DAC will only have 1 output terminal. For example, the single-ended OUT may be the same terminal as the positive output terminal 310.1 shown in FIG. 3. In the single ended implementation, the negative output terminal 310.2 may be connected to the ground GND or a common mode voltage VCM. That is, just one of the two outputs may be used and the other may be discarded. The circuit of the single ended implementation of the charge redistribution DAC 300 has no other changes from the differential implementation of the charge redistribution DAC 300 shown in FIG. 3.

In one embodiment (e.g., the charge redistribution DAC 200 or the charge redistribution DAC 300), the first reference voltage $V_{REF1}$ may have a higher voltage value than the second reference voltage $V_{REF2}$. For example, the first reference voltage may be a positive reference value $V_{REF+}$ (e.g., the positive power supply VDD) and the second reference voltage $V_{REF2}$ may be a positive reference value lower than $V_{REF+}$, or the ground GND, or a negative reference value $V_{REF-}$ (e.g., negative power supply VSS).

In addition, in one embodiment, the second sides of the charge redistribution DAC 200 or the charge redistribution DAC 300 may all be electrically connected together during the second phase of operation. Further, in one embodiment, the second sides of the charge redistribution DAC 200 or the charge redistribution DAC 300 may all be driven to a common-mode voltage VCM2 during the second phase of operation. The common-mode voltage VCM2 may be the same of the common-mode voltage VCM connected to the DAC output lines during the first phase of operation or a different voltage value. In another embodiment, the VCM2 may be different from the VCM.

Figure 4:
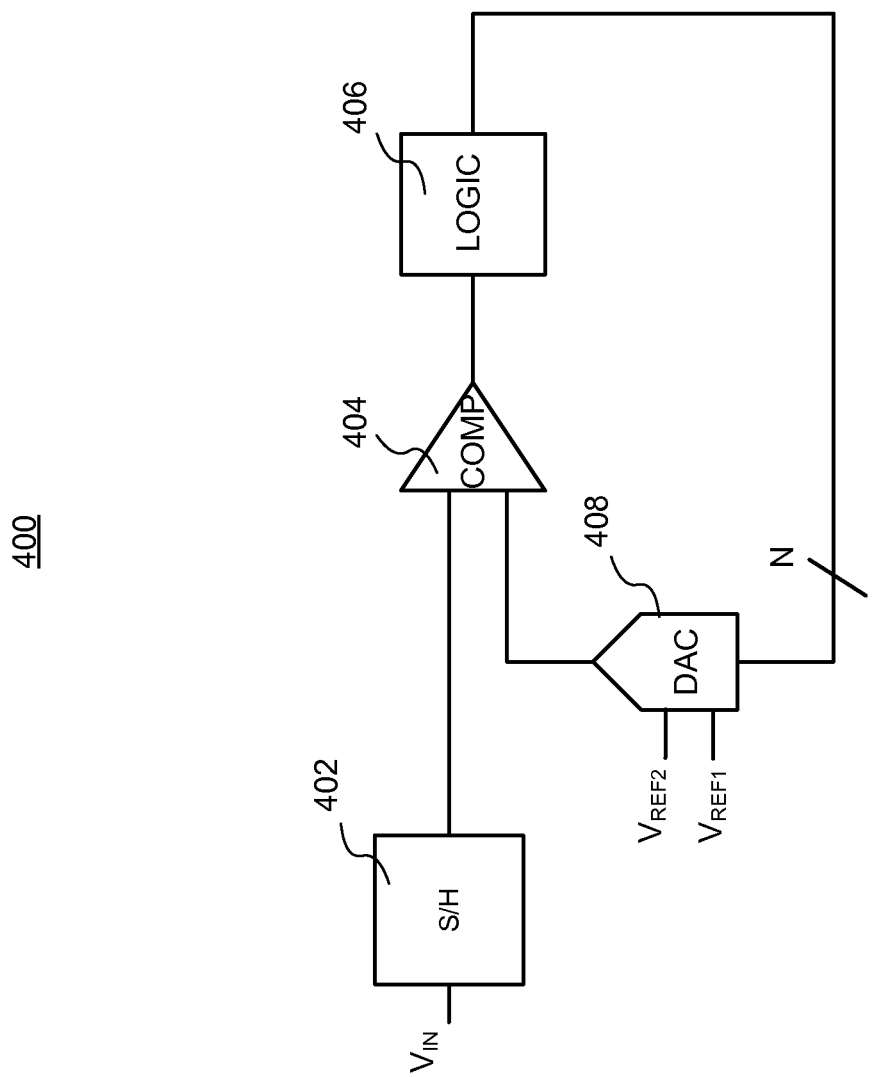
FIG. 4 shows a SAR ADC with a charge redistribution DAC according to an embodiment of the present invention.

FIG. 4 shows a SAR ADC 400 with a charge redistribution DAC according to an embodiment of the present invention. The SAR ADC 400 may comprise a sample-and-hold circuit (S/H) 402, a voltage comparator 404, an internal N-bit DAC 408 and a digital control logic block 406. During operations, the S/H circuit 402 may acquire an input voltage $V_{in}$ and the analog voltage comparator 404 may compare the input voltage $V_{in}$ to the output of the internal N-bit DAC 408. The result of the comparison may be output to the digital control logic block 406, which may supply an approximate digital code of $V_{in}$ to the N-bit DAC 408. The approximate digital code of $V_{in}$ may be an N-bit control word (e.g., the DAC input word according to an embodiment of the present invention). In one embodiment, the S/H circuit 402 may be incorporated into the DAC module 408.

The digital control logic block 406 may include a successive approximation register. The SAR ADC 400 may operate as follows. The successive approximation register may be initialized so that the most significant bit (MSB) may be equal to a digital 1. This code may be fed into the DAC 408, which then may supply the analog equivalent of this digital code $$\left(\text{e.g., } \frac{V_{REF1} + V_{REF2}}{2}\right)$$

into the comparator circuit for comparison with the sampled input voltage V. If this analog voltage exceeds $V_{in}$ the comparator 404 may cause the SAR to leave this bit as 1; otherwise, the bit may be reset. Then the next bit may set to 1 and the same test may be performed. This binary search may be continued until every bit in the SAR has been tested. The resulting code may be the digital approximation of the sampled input voltage $V_{in}$ and may be finally output by the SAR ADC 400 at the end of the conversion (EOC).

The internal N-bit DAC 408 of the SAR ADC 400 may be an N-bit charge redistribution DAC according to an embodiment of the invention (e.g., the DAC 200, 200A, 300). In one embodiment, the DAC 408 may be controlled to sequentially test each bit of the DAC input word. Because a SAR makes its bit decisions sequentially in time, improvements to the DAC settling time may have a significant impact on the maximum SAR throughput.

Figure 5:
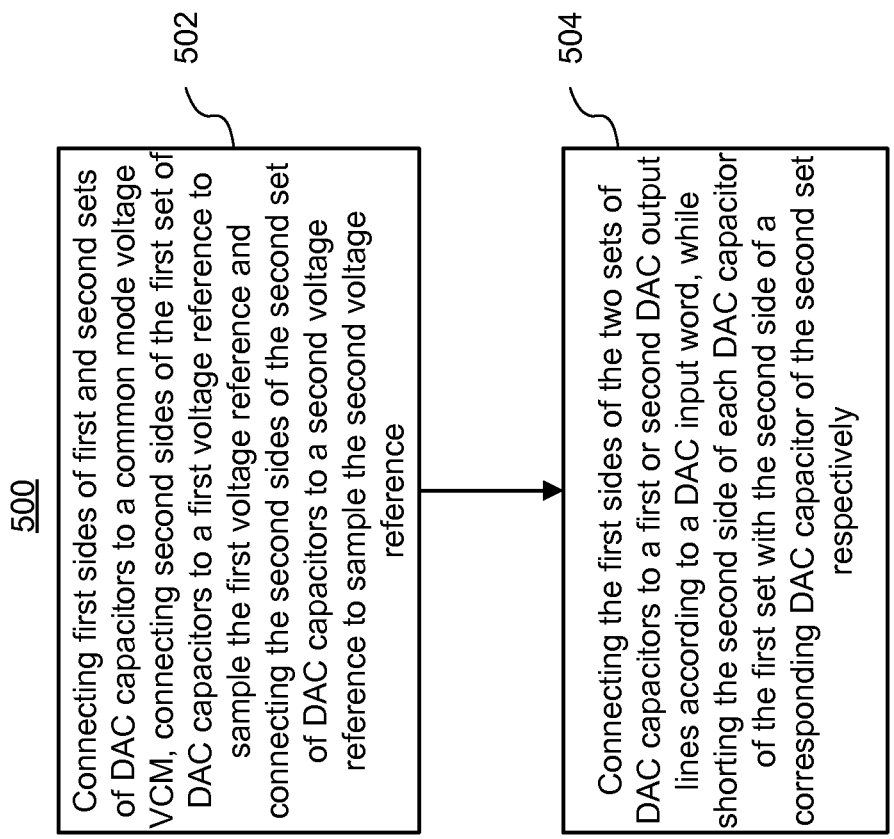
FIG. 5 shows a process of a charge redistribution DAC according to an embodiment of the present invention.

FIG. 5 shows a process flow 500 for a charge redistribution DAC according to an embodiment of the present invention. The process 500 may start at block 502. At block 502, first sides of the sets of the first and second capacitors may be connected to a common mode voltage VCM, while second sides of the first capacitors may be connected to a first voltage reference and second sides of the second capacitors may be connected to a second voltage reference. For example, as described with respect to FIGS. 2 and 3 above, during a Sample Phase of operation, both the charge redistribution DAC 200 and charge redistribution DAC 300 may have the first (or top) sides of the first and second capacitors connected to the common mode voltage VCM while the first capacitors have their second sides connected to the first voltage reference $V_{REF1}$ and the second capacitors have their second sides connected to the second voltage reference $V_{REF2}$.

In one embodiment, the charge redistribution DAC may be an internal DAC of an ADC. In this embodiment, the block 502 may be performed while a sample and hold circuit (S/H) of the ADC may be sampling an input voltage V. Thus, an example ADC according to the present invention may have its DAC sample the external reference voltages to the first and second capacitors while the S/H of the ADC samples the input voltage V.

At completion of block 502, the process 500 may proceed to block 504. At block 504, the first sides of the two sets of DAC capacitors may be connected to a positive or negative output terminals according to a DAC input word, while the second sides of each pair of first and second capacitors may be respectively shorted together. For example, as described above with respect to FIGS. 2 and 3, during a second phase of operation, the two DAC output terminals may be disconnected from the external common mode voltage VCM and the first sides (e.g., front plates) of the two sets of DAC capacitors may be connected to the two DAC output terminals according to the DAC input word and the second sides (e.g., back plates) of the two sets of DAC capacitors may be shorted in pairs and disconnected from the external reference voltages $V_{REF1}$ and $V_{REF2}$.

In one embodiment, the charge redistribution DAC may be an internal DAC of an ADC. In this embodiment, the block 504 may be performed after the ADC has completed its sampling of the input voltage $V_{in}$. Further, in this stage of operation, an example ADC according to the present invention may change the DAC code as many times as needed. Thus, the ADC may perform a series of comparison of the sampled input voltage to a plurality of DAC coded by changing the DAC input word among a plurality of values. Because the charge is redistributed between DAC capacitors, the ADC according to the present invention may improve its performance.

Figure 6B:
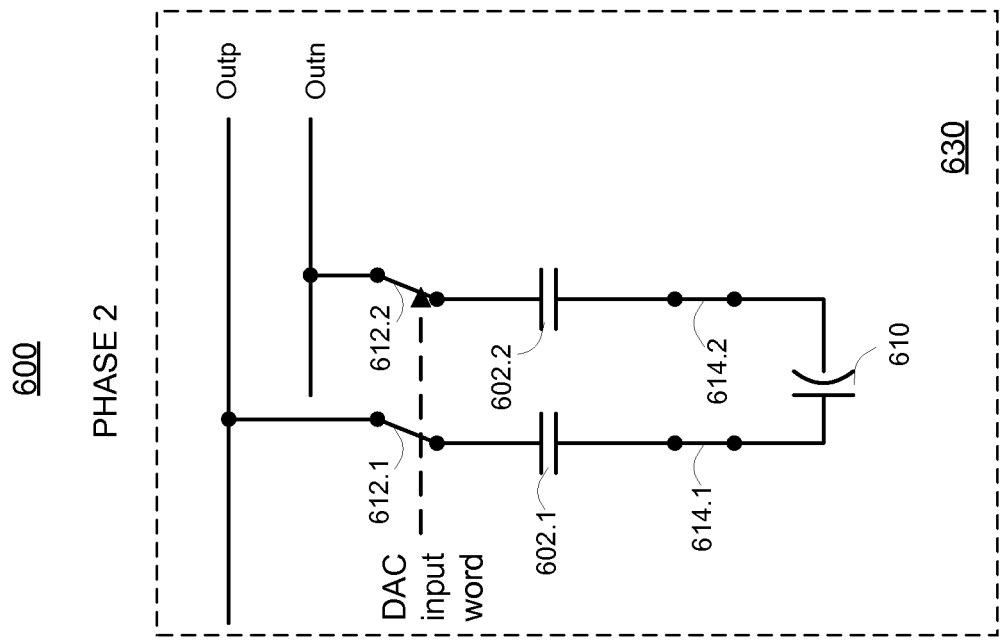
FIGS. 6A and 6B shows a pair of DAC capacitors in another embodiment of a charge redistribution DAC according to an embodiment of the present invention.
Figure 6A:
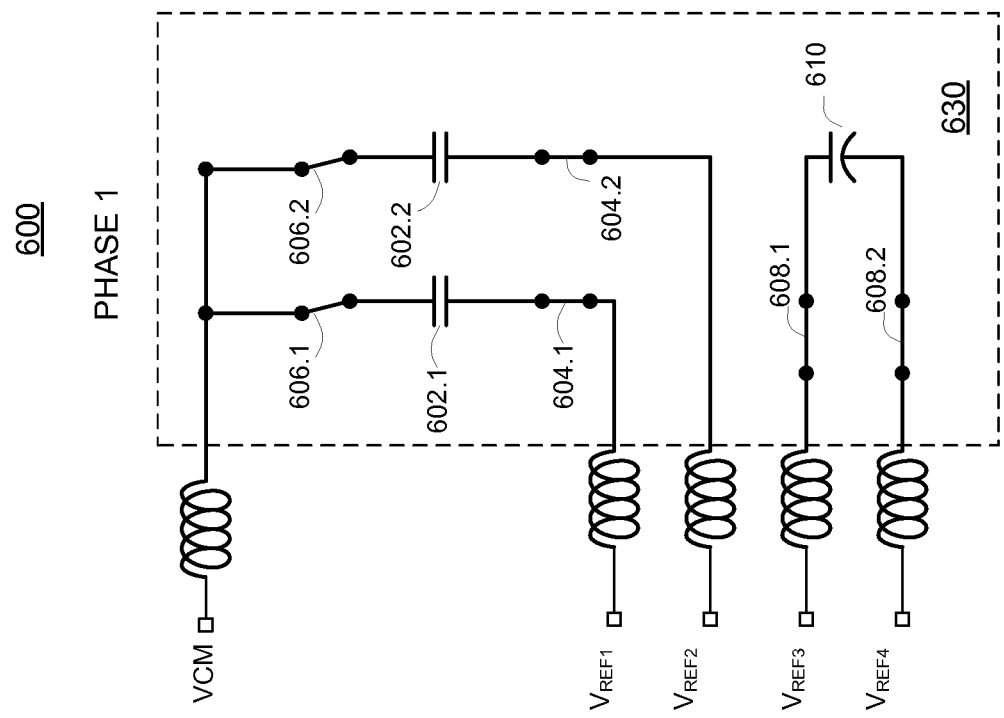

FIGS. 6A and 6B show one pair of DAC capacitors 602.1 and 602.2 in another embodiment of a charge redistribution DAC 600 according to an embodiment of the present invention. The pair of DAC first and second capacitors 602.1 and 602.2 may be one example pair of a plurality of pairs of DAC capacitors for the charge redistribution DAC 600. As shown in FIG. 6A, top sides (e.g., first sides) of the pair of DAC capacitors 602.1 and 602.2 may be electrically connected to a common-voltage VCM during a first phase of operation (e.g., Phase I) by a pair of switches 606.1 and 606.2. The bottom sides (e.g., second sides) of the capacitors 602.1 and 602.2 may be electrically connected to first and second external power supplies $V_{REF1}$ and $V_{REF2}$ by a pair of switches 604.1 and 604.2 respectively. The DAC 600 may further comprise a reservoir capacitor $C_{RES}$ 610. The first and second sides of the reservoir capacitor $C_{RES}$ 610 may be electrically connected to third and fourth external power supplies $V_{REF3}$ and $V_{REF4}$ by a pair of switches 608.1 and 608.2 respectively.

In Phase II, the switches 606.1 and 606.2, 606.1 and 606.2, and 606.1 and 606.2 may be left open (not shown). That is, the first sides of the DAC capacitors 602.1 and 602.2 may be disconnected from the VCM, the second sides of the DAC capacitors 602.1 and 602.2 may be disconnected from the external voltages $V_{REF1}$ and $V_{REF2}$, and the reservoir capacitor $C_{RES}$ 610 may be disconnected from the external voltages $V_{REF3}$ and $V_{REF4}$. As shown in FIG. 6B, in Phase II, the first sides of the DAC capacitors 602.1 and 602.2 may be electrically connected to DAC positive or negative output terminals Outp or Outn respectively according to a DAC input word Similar to the DAC input control in the DAC 200 and DAC 300, if selected, the first side of the first capacitor may be connected to the positive output Outp and the first side of the second capacitor may be connected to the negative output Outn; if not selected, the first side of the first capacitor may be connected to the negative output Outn and the first side of the second capacitor may be connected to the positive output Outp. The second sides of the DAC capacitors 602.1 and 602.2 may be electrically connected to the two sides of the reservoir capacitor $C_{RES}$ 610. For example, the second side of the capacitor 602.1 may be electrically connected to a first side of the reservoir capacitor $C_{RES}$ 610 that has been electrically connected to the external voltage $V_{REF3}$ and the second side of the capacitor 602.2 may be electrically connected to a second side of the reservoir capacitor $C_{RES}$ 610 that has been electrically connected to the external voltage $V_{REF4}$. In one embodiment, the external voltages may a relationship of $V_{REF1}=V_{REF4}$ and $V_{REF2}$ and $V_{REF3}$.

In one embodiment, the charge redistribution DAC 600 may have a plurality of binary weighted capacitors (similar to the charge redistribution DAC 200) or thermometer coded unit capacitance capacitors (similar to the charge redistribution DAC 300). That is, the DAC capacitors 602.1 and 602.2 may be an example pair of the multiple pairs of the DAC capacitors.

In one embodiment, the charge redistribution DAC 600 may have a reservoir capacitor $C_{RES}$ 610 for each pair of DAC capacitors of plurality of binary weighted or thermometer coded capacitors. In another embodiment, the charge redistribution DAC 600 have one single reservoir capacitor $C_{RES}$ 610 shared by all DAC capacitors. With the reservoir capacitor $C_{RES}$ 610, the second sides of the DAC capacitors aren't shorted to $(V_{REF1}+V_{REF1})/2$, but instead go to the reservoir voltages. This may cause the charge transfer of DAC 600 to be different from the DAC 200 and DAC 300. For example, for a binary weighted capacitor of 4C, if $V_{REF1}$=Vref, $V_{REF2}$=GND, charge transferred from the 4C capacitor may be $(V_{REF1}-V_{REF2}/2)*4C=(Vref/2)*4C$. With the reservoir cap $C_{RES}$ 610 shown in FIGS. 6A and 6B, the charge transfer may be $(V_{REF1}-V_{REF3})*4C$. If $V_{REF1}=V_{REF4}$=Vref and $V_{REF2}=V_{REF4}$=GND, then the charge transfer may be Vref*4C. This is twice the charge compared to shorting the backplates. That is, using a reservoir capacitor $C_{RES}$ 610 may get more charge transfer. In one embodiment, the reservoir capacitor $C_{RES}$ 610 may be incorporated on an integrated circuit (IC) chip 630 as other components of the DAC 600, and the reservoir capacitor $C_{RES}$ 610 may be referred to as an on-chip reservoir capacitor.

In previous examples DAC 200, DAC 300 or DAC 600, the N-bit DAC may have a number N being an integer number. For example, for N=3, in a binary weighted capacitor implementation, there may be three pairs of capacitors with capacitance of 4C, 2C, 1C and controlled by 3 sets of switches and 3 signals; in a thermometer coded implementation, there may be 7 pairs of capacitors of equal capacitance. In another embodiment, a charge redistribution N-bit DAC according to the present invention may have a number N being a fractional number. For example, a charge redistribution DAC according to the present invention may have pairs of capacitors with capacitance of 4C, 2C, 1C, 1C, 1C respectively (e.g., 9C of first and second capacitors capacitance respectively). The five pairs of the capacitors may be controlled by 5 sets of switches and 5 signals. In this case, the total output range may be 0-9 (10 levels, instead of the traditional 8 levels). The DAC may be considered a 3.3 bit DAC (N=3.3), which comes from $\log_2(10)=3.3$. In one embodiment, the DAC control word may be rounded to a next integer larger than the fractional number. For example, for a 3.3 bit DAC, the DAC control word may be a 4-bit word, with some of the DAC codes unused. In another embodiment, the DAC may have a thermometer coded control word, with 9 signals (e.g., for 9 pair of unit capacitors).

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A charge redistribution digital-to-analog converter (DAC), comprising:
   a plurality of pairs of first and second capacitors, each having a first side and a second side;
   a group of first switches, each first switch selectively controlling connection of the first side of a respective first capacitor to one of a pair of output signal lines, the group of first switches being controlled by a DAC input word;
   a group of second switches, each second switch selectively controlling connection of the first side of a respective second capacitor to one of a pair of output signal lines, the group of second switches being controlled by the DAC input word;
   a group of bridging switches, each connected between second sides of paired first and second capacitors; and
   a pair of switches connecting the pair of output signal lines to a common-mode voltage VCM during a first phase of operation.

2. The charge redistribution DAC of claim 1, further comprising first and second sets of sampling switches, each first sampling switch coupling the second side of a respective first capacitor to a first reference voltage source and each second sampling switch coupling the second side of a respective second capacitor to a second reference voltage source.

3. The charge redistribution DAC of claim 1, further comprising a plurality of switches connecting the first sides of plurality of pairs of first and second capacitors to a common-mode voltage VCM.

4. The charge redistribution DAC of claim 1, wherein the plurality of pairs of first and second capacitors have common capacitances.

5. The charge redistribution DAC of claim 1, wherein the plurality of pairs of first and second capacitors are binary weighted according to the pair's bit position.

6. The charge redistribution DAC of claim 1, wherein charge redistribution takes place between the two capacitors of each pair when the DAC input word is applied.

7. The charge redistribution DAC of claim 1, the shorted second sides of each pair of capacitors is coupled to a common-mode voltage during operation.

8. The charge redistribution DAC of claim 1, wherein during the first phase of operation, the first sides of the first and second capacitors are connected the common-mode voltage VCM, the second sides of the first capacitors are connected to a first reference voltage source and the second sides of the second capacitors are connected to a second reference voltage source.

9. The charge redistribution DAC of claim 8, wherein during a second phase of operation, the first group of switches connect the first sides of the first and second capacitors to the first or second signal lines according to the DAC input word and the second sides of each pair of capacitors are shorted together respectively.

10. The charge redistribution DAC of claim 9, wherein the first and second capacitors are two sets of binary weighted capacitors and the number of capacitors in each set is equal to the number of bits of the DAC input word, and
    wherein during the second phase of operation, each bit of the DAC input word determines connection of the first sides of one pair of capacitors.

11. The charge redistribution DAC of claim 9, further comprising a decoder to decode the DAC input word and generate control signals for the first group of switches,
    wherein each capacitor of the first and second sets of capacitors has equal capacitance and a total number of the capacitors of each set is equal to $2^N-1$ with N being an integer larger than one that represents a total number of bits of the DAC input word, and
    wherein during the second phase of operation, a selected number of the capacitors of the first set are controlled by the decoder to be connected to the first signal line and remaining capacitors of the first set are controlled by the decoder to be connected to the second signal line, the selected number is equal to a value of the DAC input word.

12. The charge redistribution DAC of claim 8, wherein the first and second reference voltage sources are power supplies external to an integrated circuit (IC) chip on which the DAC is located.

13. The charge redistribution DAC of claim 8, wherein the charge redistribution DAC is in an analog-to-digital converter (ADC).

14. The charge redistribution DAC of claim 13, wherein the ADC is a successive approximation ADC, and the first and second capacitors sample the first and second reference voltage sources at the same time that the ADC samples an input voltage.

15. The charge redistribution DAC of claim 1, the first and second signal lines form a differential output.

16. The charge redistribution DAC of claim 1, the first signal line provides a single DAC output.

17. A method of generating an analog voltage from a digital input code, comprising:
  during a sampling phase of operation, connecting a pair of output signal lines to a common-mode voltage, sampling a first reference voltage on a first plurality of sampling capacitors, and sampling a second reference voltage on a second plurality of sampling capacitors; and
  during an output phase of operation, shorting first plates of the first and second sampling capacitors together on a pairwise basis, and connecting a second plate of one of the paired first or second sampling capacitor to an output terminal, the first or second sampling capacitor selected in response to the digital input code.

18. A method of generating a digital-to-analog output for a digital-to-analog converter (DAC), comprising:
  connecting first sides a plurality of pairs of first and second capacitors to a common mode voltage;
  connecting a pair of output signal lines to the common-mode voltage during a first phase of operation;
  sampling a first external reference voltage to second sides of each of first capacitors, and sampling a second external reference voltage to second sides of each of second capacitors;
  disconnecting the first sides of the plurality of pairs of first and second capacitors from the common mode voltage, and connecting the first sides of the first and second capacitors to a first or second signal lines according to a DAC input word; and
  disconnecting the second sides of the first and second capacitors from the first and second external reference voltages, and shorting the second sides of the first and second set of capacitors in pairs respectively.

19. The method of claim 18, wherein charge redistribution takes place between the two capacitors of each pair when the DAC input word is applied.

20. The method of claim 18, wherein the DAC is in a successive approximation analog-to-digital converter (ADC) and the first and second capacitors sample the external reference voltages at the same time that the ADC samples an input voltage.

21. The method of claim 20, wherein when the first and second capacitors are disconnected from the external reference voltages and the common mode voltage, the DAC input word changes sequentially among a plurality of values to change redistribution among the first and second capacitors to generate a plurality of DAC outputs.

22. The method of claim 18, wherein the first and second capacitors are two sets of binary weighted capacitors and the number of capacitors in each set is equal to the number of bits of the DAC input word, and each bit of the DAC input word determines connection of the first sides of one pair of capacitors.

23. The method of claim 18, further comprising decoding the DAC input word and generate control signals for connection of the first sides of the plurality of pairs of first and second capacitors,
  wherein each capacitor has equal capacitance and a total number of the first or second capacitors is equal to $2^N-1$ with N being an integer larger than one that represents a total number of bits of the DAC input word, and
  wherein during operation, a selected number of the first capacitors are controlled by the control signals to be connected to the first signal line and remaining first capacitors are controlled by the decoder to be connected to the second signal line, the selected number is equal to a value of the DAC input word.

24. An analog-to-digital converter (ADC), comprising:
  a charge redistribution digital-to-analog converter (DAC), comprising:
    a plurality of pairs of first and second capacitors, each having a first side and a second side;
    a group of first switches, each first switch selectively controlling connection of the first side of a respective first capacitor to one of a pair of output signal lines, the group of first switches being controlled by a DAC input word;
    a group of second switches, each second switch selectively controlling connection of the first side of a respective second capacitor to one of a pair of output signal lines, the group of second switches being controlled by the DAC input word;
    a group of bridging switches, each connected between second sides of paired first and second capacitors; and
    a pair of switches connecting the pair of output signal lines to a common-mode voltage VCM during a first phase of operation.

25. The ADC of claim 24, wherein charge redistribution takes place between the two capacitors of each pair when the DAC input word is applied.

26. The ADC of claim 24, wherein the ADC is a successive approximation ADC, and the first and second capacitors sample the first and second reference voltages at the same time that the ADC samples an input voltage.

27. An integrated circuit (IC) chip, comprising:
  a charge redistribution digital-to-analog converter (DAC), comprising:
    a plurality of pairs of first and second capacitors, each having a first side and a second side;
    a group of first switches, each first switch selectively controlling connection of the first side of a respective first capacitor to one of a pair of output signal lines, the group of first switches being controlled by a DAC input word;
    a group of second switches, each second switch selectively controlling connection of the first side of a respective second capacitor to one of a pair of output signal lines, the group of second switches being controlled by the DAC input word;
    a group of bridging switches, each connected between second sides of paired first and second capacitors; and
    a pair of switches connecting the pair of output signal lines to a common-mode voltage VCM during a first phase of operation.

28. The IC chip of claim 27, wherein charge redistribution takes place between the two capacitors of each pair when the DAC input word is applied.

29. The IC chip of claim 27, wherein the charge redistribution DAC is in an analog-to-digital converter (ADC) and the ADC is a successive approximation ADC, and the first and second capacitors sample the first and second reference voltages at the same time that the ADC samples an input voltage.

30. A charge redistribution digital-to-analog converter (DAC), comprising:
  a plurality of pairs of first and second capacitors, each having a first side and a second side;
  a group of first switches, each first switch selectively controlling connection of the first side of a respective first capacitor to one of a pair of output signal lines, the group of first switches being controlled by a DAC input word;
  a group of second switches, each second switch selectively controlling connection of the first side of a respective second capacitor to one of a pair of output signal lines, the group of second switches being controlled by the DAC input word;

a group of third switches, each third switch connecting the second side of a respective first and second capacitor to an on-chip reservoir capacitor; and a pair of switches connecting the pair of output signal lines to a common-mode voltage VCM during a first phase of operation.

31. The charge redistribution DAC of claim 30, wherein the on-chip reservoir capacitor is shared by all first and second capacitors.

32. The charge redistribution DAC of claim 30, wherein each pair of first and second capacitors have a respective on-chip reservoir capacitor.

* * * * *

UNITED STATES PATENT AND TRADEMARK OFFICE
CERTIFICATE OF CORRECTION

PATENT NO. : 8,537,045 B2  
APPLICATION NO. : 13/096686  
DATED : September 17, 2013  
INVENTOR(S) : Kapusta Page 1 of 1

It is certified that error appears in the above-identified patent and that said Letters Patent is hereby corrected as shown below:

In the Claims

In column 10, line 19, change

"connected the common-mode voltage"
to
--connected to the common-mode voltage--

Signed and Sealed this
Twenty-ninth Day of September, 2015

Michelle K. Lee
*Director of the United States Patent and Trademark Office*